(12) United States Patent
Park et al.

(10) Patent No.: US 7,489,714 B2
(45) Date of Patent: Feb. 10, 2009

(54) SPECKLE REDUCTION LASER AND LASER DISPLAY APPARATUS HAVING THE SAME

(75) Inventors: Yong-hwa Park, Yongin-si (KR); Kyoung-ho Ha, Seoul (KR); Jun-o Kim, Yongin-si (KR); Yong-kweun Mun, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/843,211

(22) Filed: Aug. 22, 2007

(65) Prior Publication Data
US 2008/0180776 A1    Jul. 31, 2008

(30) Foreign Application Priority Data
Jan. 26, 2007    (KR) ...................... 10-2007-0008585

(51) Int. Cl.
*H01S 3/123*    (2006.01)
*H01S 3/10*    (2006.01)
*H01S 3/08*    (2006.01)

(52) U.S. Cl. ............................ 372/20; 372/15; 372/99; 372/107

(58) Field of Classification Search .................. 372/15, 372/20, 99, 107; 359/196
See application file for complete search history.

*Primary Examiner*—Armando Rodriguez
(74) *Attorney, Agent, or Firm*—Sughrue Mion, PLLC

(57) ABSTRACT

A speckle reduction laser and a laser display apparatus having the speckle reduction laser are provided. The speckle reduction laser includes a semiconductor unit that comprises an active layer and emits laser light through a first side surface thereof by resonating light generated from the active layer, and a vibration mirror unit disposed adjacent to a second side surface of the semiconductor unit. The laser further includes a mirror, and the resonance of the laser light is generated between the first side surface of the semiconductor unit and the mirror, and a resonance mode of the laser light is changed according to the vibration of the mirror.

17 Claims, 11 Drawing Sheets

SPECKLE REDUCTION LASER AND LASER DISPLAY APPARATUS HAVING THE SAME

CROSS-REFERENCE TO RELATED PATENT APPLICATION

This application claims priority from Korean Patent Application No. 10-2007-0008585, filed on Jan. 26, 2007, in the Korean Intellectual Property Office, the disclosure of which is incorporated herein in its entirety by reference.

BACKGROUND OF THE INVENTION

1. Field of the Invention

Apparatuses consistent with the present invention relate to a speckle reduction laser and a laser display apparatus having the same, and more particularly, to a speckle reduction laser that reduces speckles by changing a resonance mode and a laser display apparatus having the same.

2. Description of the Related Art

With the rapid emergence of multi-media society, the demands for displaying large, high definition images have constantly increased. Also, recent multi-media advancements provide for the realization of an improved natural color in addition to displaying large, high resolution images.

In order to realize an improved natural color, it is essential to use a light source such as a laser having a high color purity. However, when an image is realized using a laser as a light source, the image quality is degraded due to speckles caused by the coherence of the laser light. The speckles are an arbitrary interference pattern of light, that is, noise formed on the retina by entering light which is scattered due to the surface roughness of a screen when the laser light is reflected at the surface of the screen.

SUMMARY OF THE INVENTION

The present invention provides a speckle reduction laser that reduces speckles by changing a resonance mode using a vibrating mirror and a laser display apparatus having the speckle reduction laser.

According to an aspect of the present invention, there is provided a speckle reduction laser comprising: a semiconductor unit that comprises an active layer and emits laser light through a first side surface thereof by resonating light generated from the active layer; and a vibration mirror unit disposed adjacent to a second side surface of the semiconductor unit. the laser further comprises a mirror, wherein the resonance of the laser light is generated between the first side surface of the semiconductor unit and the mirror, and a resonance mode of the laser light is changed according to a vibration of the mirror.

The speckle reduction laser may further comprise an anti-reflective member provided on the second side surface of the semiconductor unit.

The semiconductor unit may comprise a half mirror on the first side surface thereof, wherein the laser light is emitted through the half mirror.

A variation width of a resonance mode of the laser light may be equal to or smaller than a resonance modes spacing when the resonance mode is viewed in a frequency spectrum.

According to an aspect of the present invention, there is provided a laser display apparatus that displays an image by scanning laser light on a screen, and comprises a laser lighting system having the speckle reduction laser described above.

A vibration frequency of the vibration mirror unit may be equal to or greater than a pixel frequency of an image displayed by the laser display apparatus.

The laser display apparatus may be a surface projection type that further comprises an image forming device that forms an image corresponding to an image signal input from laser light emitted from the laser lighting system; and a projection optical system that enlarges and projects an image formed in the image forming device onto a screen.

The laser display apparatus may further comprise a scan system that forms an image by scanning the laser light emitted from the laser lighting system onto the screen.

BRIEF DESCRIPTION OF THE DRAWINGS

The above and other exemplary aspects and advantages of the present invention will become more apparent by describing in detail exemplary embodiments thereof with reference to the attached drawings in which.

DETAILED DESCRIPTION OF EXEMPLARY EMBODIMENTS OF THE INVENTION

Figure 1:
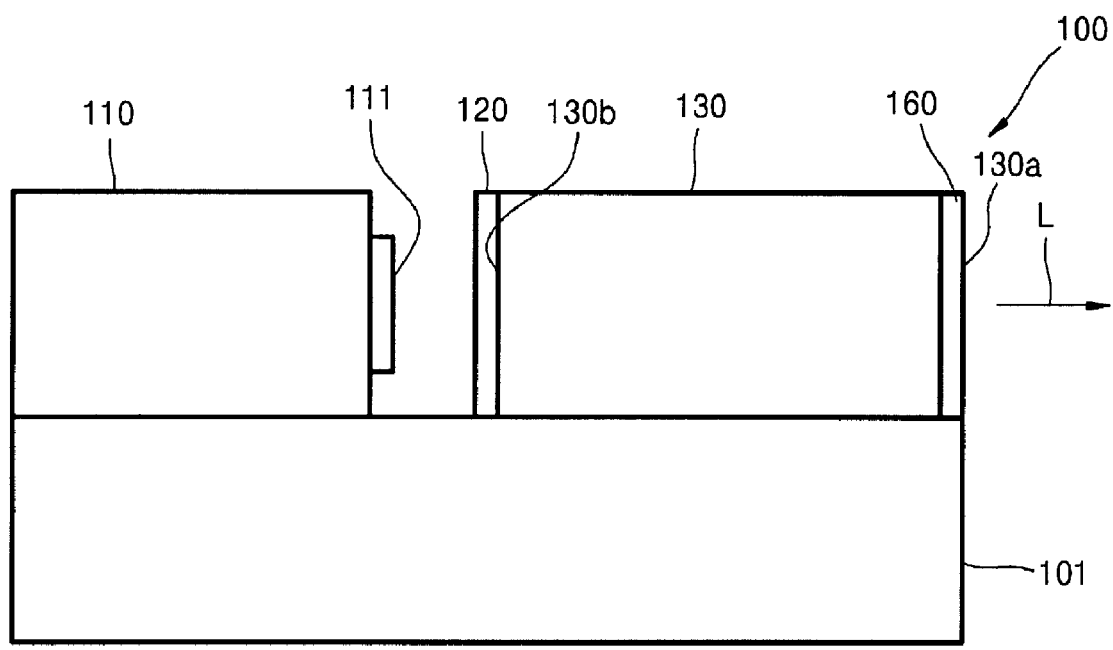
FIG. 1 is a schematic cross-sectional view illustrating a speckle reduction laser according to an exemplary embodiment of the present invention.

A speckle reduction laser and a laser display apparatus according to the present invention will now be described more fully with reference to the accompanying drawings in which exemplary embodiments of the invention are shown. In the drawings, the thicknesses of layers and regions are exaggerated for clarity, and like reference numerals refer to the like elements.

FIG. 1 is a schematic cross-sectional view illustrating a speckle reduction laser according to an embodiment of the present invention.

Referring to FIG. 1, the speckle reduction laser according to the present embodiment includes a semiconductor unit 130 that emits laser light and a vibration mirror unit 110 placed on a mount 101. The semiconductor unit 130 according to the present embodiment has a side lighting laser resonance structure in which laser light is emitted from a first side surface 130a. An antireflective member 120 is provided on a second side surface 130b of the semiconductor unit 130 so that the laser resonance of the semiconductor unit 130 can be extended towards the vibration mirror unit 110.

Figure 2:
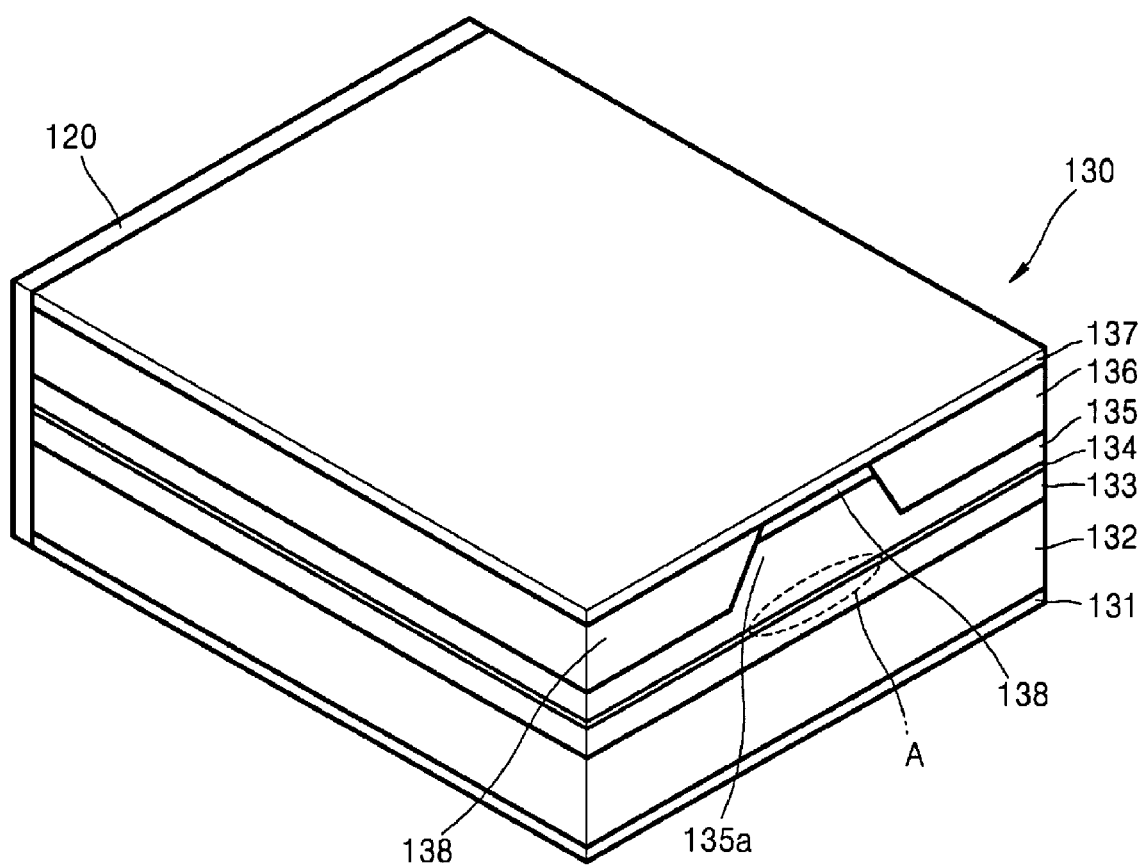
FIG. 2 is a schematic perspective view of a semiconductor unit that oscillates light of the speckle reduction laser of FIG. 1, according to an exemplary embodiment of the present invention.

FIG. 2 is a schematic perspective view of the semiconductor unit 130 that generates light in the speckle reduction laser of FIG. 1, according to an embodiment of the present invention. Referring to FIG. 2, an n-type clad/waveguide layer 133, an active layer 134, a p-type clad/waveguide layer 135 having a stripe shaped ridge portion 135a, a p-type contact layer 138, and a p-type electrode 137 are sequentially stacked on an n-type substrate 132, and an n-type electrode 131 is formed on a lower surface of the n-type substrate 132. An insulating layer 136 is formed on a side of the ridge portion 135a of the p-type clad/waveguide layer 135.

When power is applied to the n-type electrode 131 and the p-type electrode 137, electrons and holes meet in the active layer 134 and generate light. The generated light forms a predetermined mode between the n-type clad/waveguide layer 133 and the p-type clad/waveguide layer 135, and thus, is emitted through the side. A horizontal resonance mode region is limited by the ridge portion 135a of the p-type clad/waveguide layer 135, and thus, the region where light is emitted from the semiconductor unit 130 is limited to the region A near the ridge portion 135a. The region A in FIG. 2 indicates a region where light is emitted from the active layer 134. The antireflective member 120 is provided on a side of the semiconductor unit 130 so that a vertical mode resonance can be extended outside the semiconductor.

The structure of the semiconductor unit 130 described with reference to FIG. 2 is an example, and the present embodiment is not limited thereto. For example, the types of the n-type clad/waveguide layer 133 and the p-type clad/waveguide layer 135 can be reversed. Also, instead of the n-type substrate 132, an insulating substrate such as a sapphire substrate can be employed. In this case, an n-type contact layer is interposed between the substrate and the n-type clad/waveguide layer, a portion of the n-type contact is blocked, and an n-type electrode is formed in the blocked portion.

Referring to FIG. 1 again, the antireflective member 120 is provided on the second side surface 130b of the semiconductor unit 130 facing the vibration mirror unit 110. The antireflective member 120 is formed of at least one dielectric layer, and minimizes optical loss at the second side surface 130b of the semiconductor unit 130, which forms an interface with air, by appropriately controlling the refractive index and thickness thereof. That is, the reflection of light at the second side surface 130b of the semiconductor unit 130 is repressed when light is emitted towards the vibration mirror unit 110 from the semiconductor unit 130 or light reenters the semiconductor unit 130 after being reflected by the vibration mirror unit 110 so that the light can reach a resonance mode between the second side surface 130b of the semiconductor unit 130 and a mirror 111 of the vibration mirror unit 110. The antireflective member 120 corresponds to a coating film for preventing reflection and is well known in the art, thus, the detailed description thereof will be omitted.

A half mirror 160 can be provided on the first side surface 130a of the semiconductor unit 130 facing the second side surface 130b on which the reflection preventive member 120 is provided. The half mirror 160 facilitates the effective resonance of light between the first side surface 130a of the semiconductor unit 130 and the mirror 111 of the vibration mirror unit 110. However, the half mirror 160 is not an essential element in the present embodiment. Even if the half mirror 160 is not provided, a portion of light generated from an inner side of the semiconductor unit 130 can reach a resonance mode at the first side surface 130a of the semiconductor unit 130 that forms an interface with air due to a refractive index difference between the semiconductor unit 130 and external air, and the resonated portion of light can be emitted as laser light through the first side surface 130a of the semiconductor unit 130.

The vibration mirror unit 110 is located at a predetermined distance from the second side surface 130b of the semiconductor unit 130 that faces the first side surface 130a through which laser light of the semiconductor unit 130 is emitted. The vibration mirror unit 110 is disposed as close as possible to the second side surface 130b of the semiconductor unit 130 in consideration of the oscillation size of the mirror 111 of the vibration mirror unit 110.

The mount 101, on which the semiconductor unit 130 and the vibration mirror unit 110 are placed, may have a structure of a heat dissipation member or a heat sink to prevent the vibration mirror unit 110 from being deformed by heat generated from the semiconductor unit 130.

Figure 3:
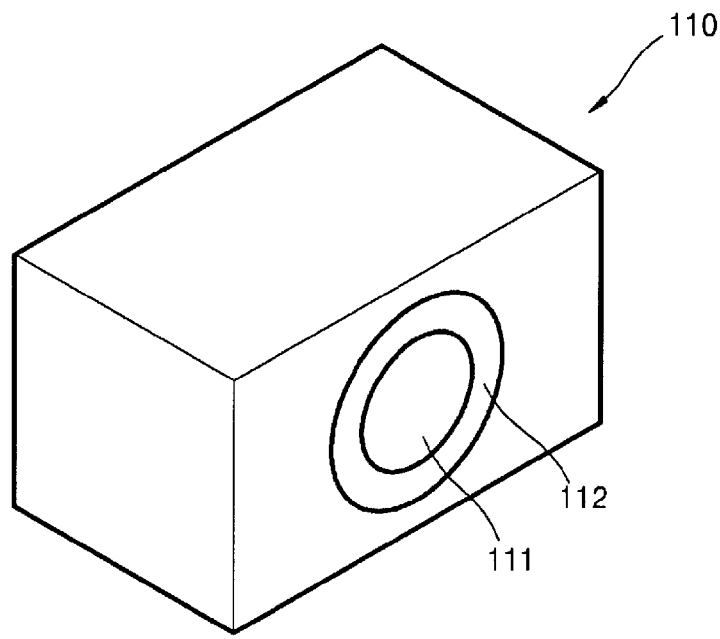
FIG. 3 is a schematic perspective view of a vibration mirror unit of the speckle reduction laser of FIG. 1, according to an exemplary embodiment of the present invention.

FIG. 3 is a schematic perspective view of the vibration mirror unit 110 of the speckle reduction laser of FIG. 1, according to an embodiment of the present invention. Referring to FIG. 3, the vibration mirror unit 110 can include a vibrator to which the mirror 111 is attached and a driving unit that drives the vibrator. The mirror 111 is attached to a vibration membrane 112. In the vibration mirror unit 110, the vibration membrane 112 vibrates by an external driving signal, and thus, the mirror 111 vibrates. A surface of the mirror 111 is disposed perpendicular to the direction of light emitted from the semiconductor unit 130 so that the light emitted from the semiconductor unit 130 towards the mirror 111 can be re-reflected towards the semiconductor unit 130.

Figure 4:
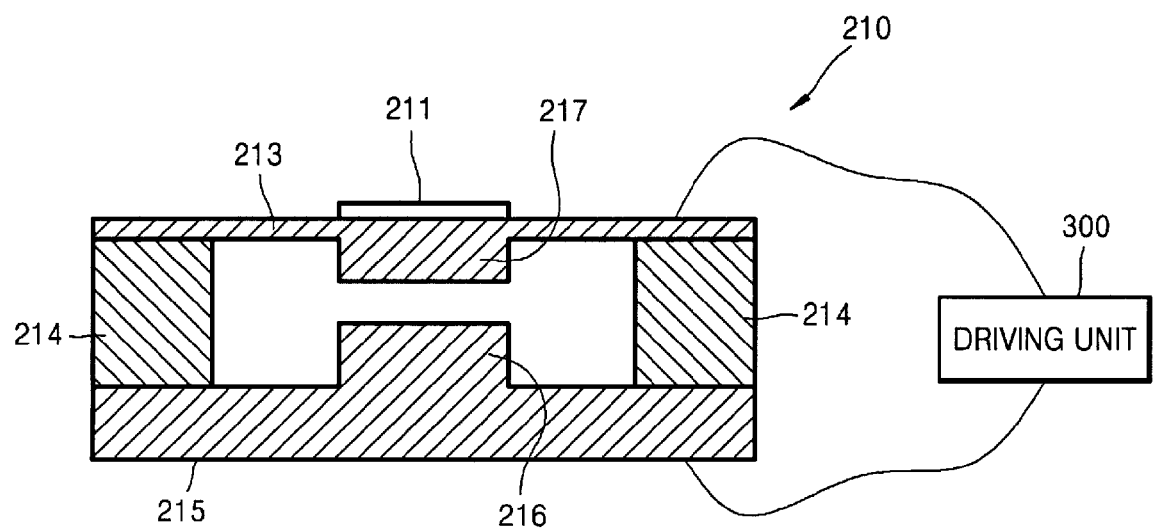
FIG. 4 is a schematic cross-sectional view of the vibration mirror unit of FIG. 1, according to an exemplary embodiment of the present invention.

The vibrator of the vibration mirror unit 110 can be a resonator, for example, an electrostatic drive type resonator or a piezoelectric drive type resonator. FIG. 4 is a cross-sectional view of an electrostatic drive type resonator 210, and FIG. 5 is a perspective view of a piezoelectric drive type resonator 310.

Referring to FIG. 4, the electrostatic drive type resonator 210 has a structure in which a vibrating plate 213 to which a mirror 211 is attached is supported by a supporter 214 on a substrate 215 and surfaces of the vibrating plate 213 and the substrate 215 facing each other are electrodes 216 and 217. The two electrodes 216 and 217 are spaced a predetermined distance apart from each other to generate an electrostatic force when the electrodes 216 and 217 are charged to different polarities from each other by a driving unit 300. The vibrating plate 213 vibrates up and down due to the periodically applied electrostatic force generated from the two electrodes 216 and 217. The electrostatic drive type resonator 210 can be readily configured to vibrate with a frequency of a few tens of MHz and with a vibration width of a few hundreds of nm. Therefore, the electrostatic drive type resonator 210 meets the vibration conditions for effectively reducing speckles as will be described later. The configuration of the electrostatic drive type resonator 210 is well known in the art, thus the detailed description thereof will be omitted.

Figure 5:
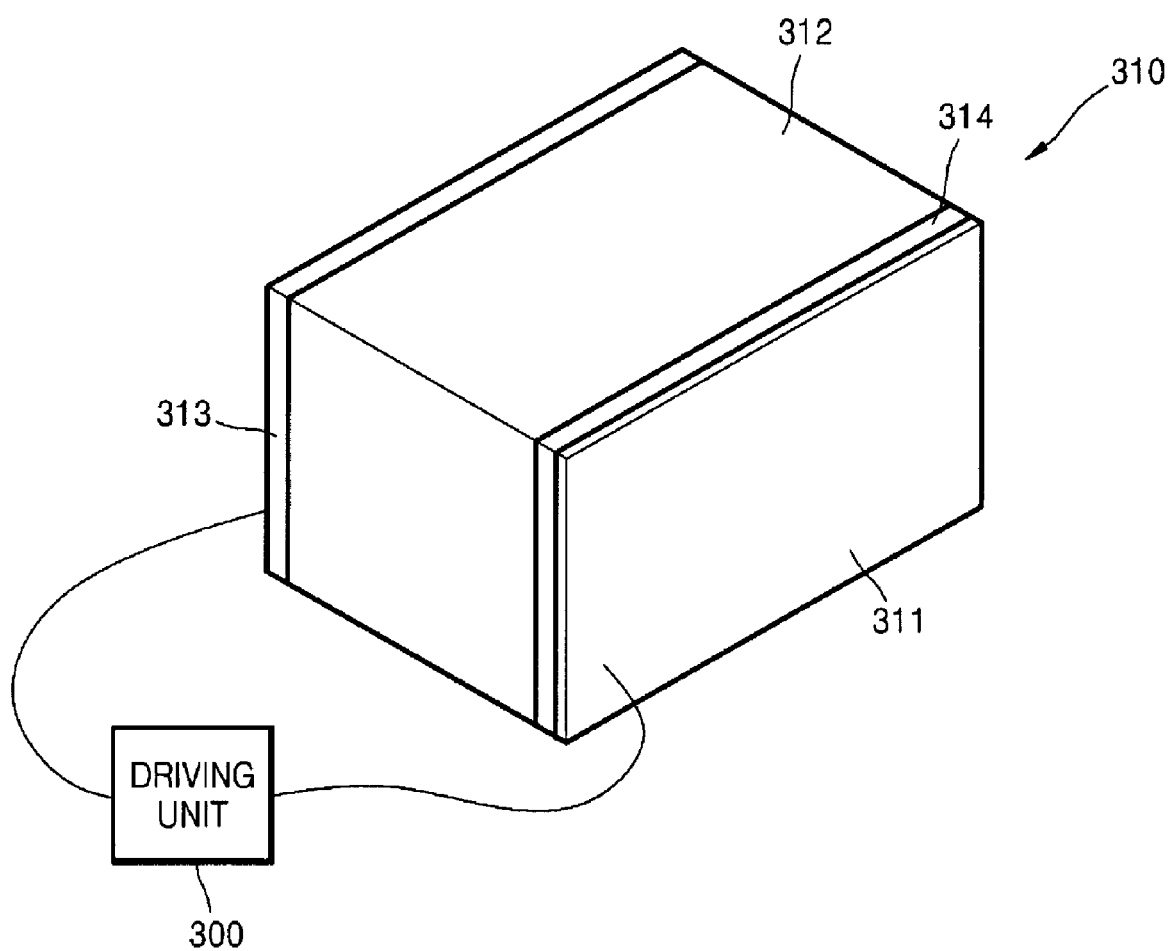
FIG. 5 is a schematic perspective view of the vibration mirror unit of FIG. 1 according to another exemplary embodiment of the present invention.

Referring to FIG. 5, the piezoelectric drive type resonator 310 includes a piezoelectric material layer 312 and electrodes 313 and 314 disposed on both sides of the piezoelectric material layer 312. When a voltage is applied to the piezoelectric material layer 312 by the driving unit 300, a deformation force is applied to the piezoelectric material layer 312, and thus, the piezoelectric material layer 312 vibrates. According to the crystal direction of the piezoelectric material layer 312, the vibration direction of the piezoelectric material layer 312 can vary. In the present embodiment, the piezoelectric material layer 312 vibrates in the direction of the electrodes 313 and 314. In this case, a mirror 311 is attached to one of the electrodes 313 and 314. The electrode 314 can be a mirror surface. The piezoelectric drive type resonator 310 can also be readily configured to vibrate with a frequency of a few tens of MHz and with a vibration width of a few hundreds of nm. Therefore, the piezoelectric drive type resonator 310 meets the vibration conditions for effectively reducing speckles as will be described later. The configuration of the piezoelectric drive type resonator 310 is well known in the art, thus the detailed description thereof will be omitted.

The vibrators described above as examples do not limit the structure of the vibrator that can be employed in the speckle reduction laser according to the present invention. Since the vibrator of the vibration mirror unit 110 is located outside of the semiconductor unit 130 through which light is emitted, as described later, if the vibrator meets the vibration conditions, the structure of the vibrator is not limited to the above description.

Figure 6:
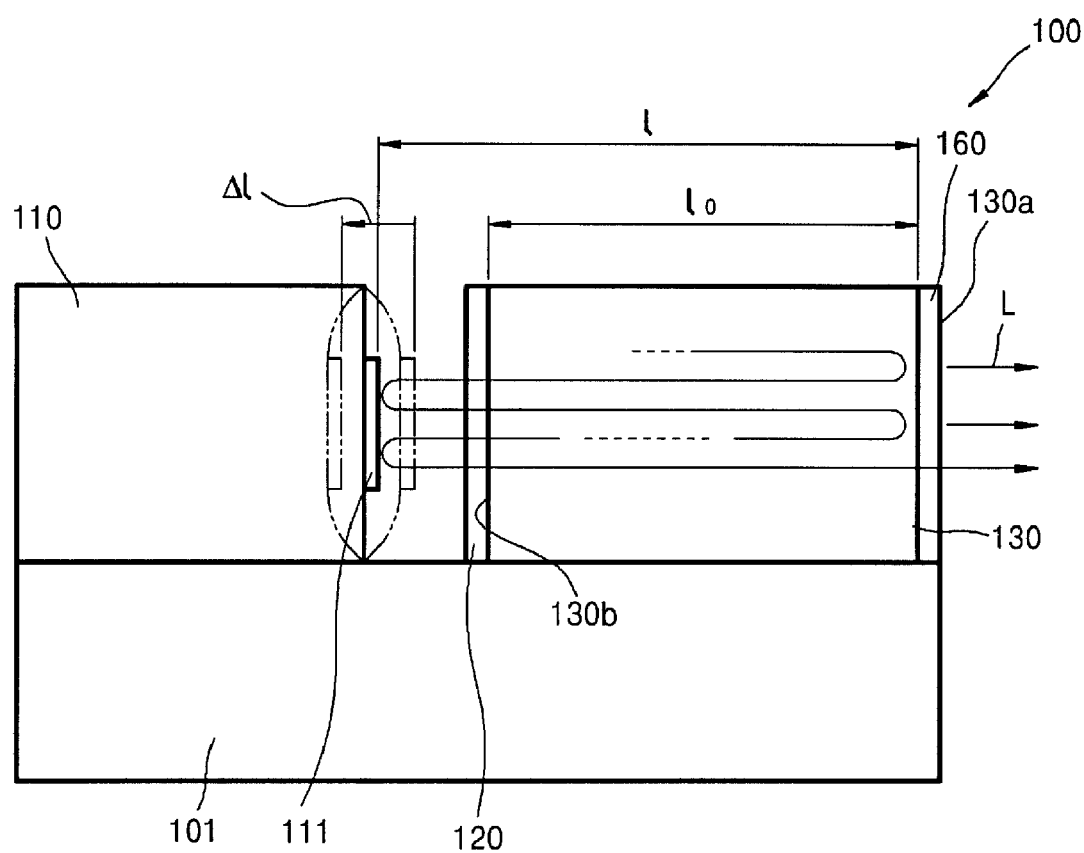
FIG. 6 is a schematic cross-sectional view for explaining an operation of the speckle reduction laser of FIG. 1, according to an exemplary embodiment of the present invention.
Figure 7:
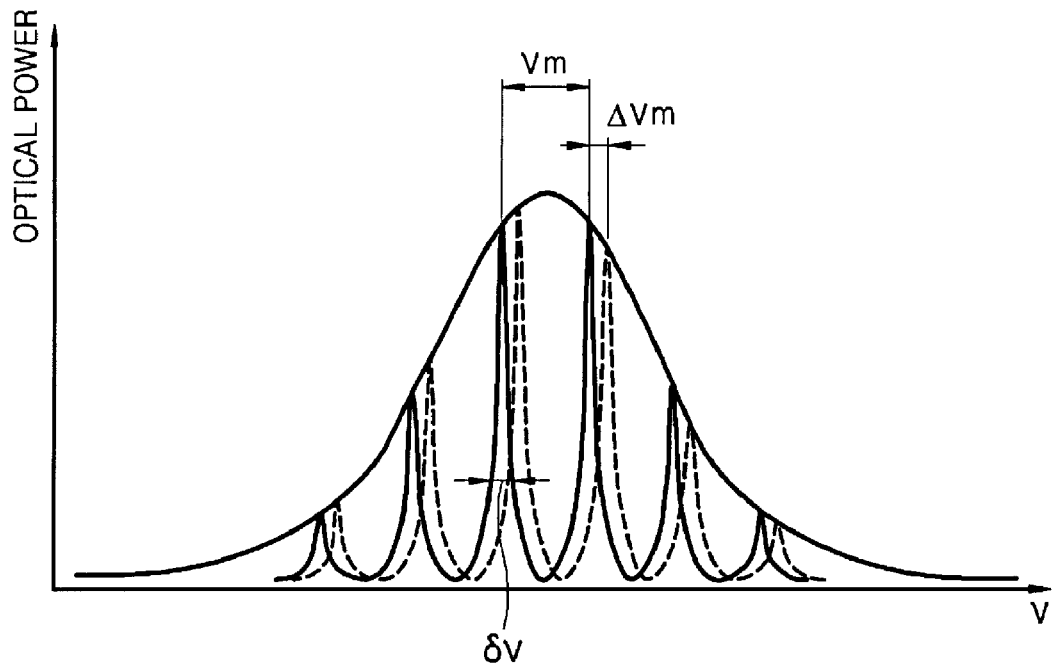
FIG. 7 is a graph showing the resonance mode change of the speckle reduction laser of FIG. 1, according to an exemplary embodiment of the present invention.

An operation of the speckle reduction laser according to an embodiment of the present invention will now be described with reference to FIGS. 6 and 7. FIG. 6 is a schematic cross-sectional view for explaining an operation of the speckle reduction laser of FIG. 1, and FIG. 7 is a graph showing the resonance mode change of the speckle reduction laser of FIG. 1.

Referring to FIG. 6, light generated from the semiconductor unit 130 is emitted towards the vibration mirror unit 110, and is reflected by the mirror 111. Afterwards, the light re-enters through the second side surface 130b of the semiconductor unit 130. The light that enters the semiconductor unit 130 is reflected by the half mirror 160 and again proceeds towards the vibration mirror unit 110. In this way, the light is trapped between the mirror 111 of the vibration mirror unit 110 and the half mirror 160, and thus, forms a resonance mode of laser light. Whenever the light resonated between the mirror 111 of the vibration mirror unit 110 and the half mirror 160 is reflected at the half mirror 160, a portion of the light is emitted to the outside, being transmitted through the half mirror 160 as laser light. As the mirror 111 of the vibration mirror unit 110 vibrates in a vertical direction (horizontally in the drawing of FIG. 6), a vibration distance changes, and accordingly, as described later, the resonance mode is changed. In FIG. 6, l indicates a resonance distance in the vertical direction, $l_o$ indicates a vertical length of the semiconductor unit 130, and $\Delta l$ indicates a vibration width of the mirror 111 of the vibration mirror unit 110, that is, the variation of resonance distance.

Next, the variation of resonance mode according to the vibration width $\Delta l$ of the vibration mirror unit 110 will now be described. For convenience of calculation, a gap between the semiconductor unit 130 and the mirror 111 of the vibration mirror unit 110 is considered negligible. Such approximation can be taken when the gap between the semiconductor unit 130 and the mirror 111 is negligibly small compared to a lengthwise direction of the semiconductor unit 130. An optical resonance distance $l_{opt}$ of the lengthwise direction of the semiconductor unit 130 is given in Equation 1 shown below when the semiconductor unit 130 is seen from the outside of the semiconductor unit 130.

$$l_{opt} = n_c l_0 + \Delta l \qquad \text{[Equation 1]}$$

where $n_c$ indicates a refraction index of the semiconductor unit 130.

Referring to Equation 1, the optical resonance distance $l_{opt}$ of the lengthwise direction of the semiconductor unit 130 is an approximate value obtained by adding the displacement $\Delta l$ of the mirror 111 to the optical resonance distance $l_{opt}$ in the lengthwise direction of the semiconductor unit 130.

Meanwhile, when the variation of the resonance mode viewed in a frequency spectrum is indicated as $\Delta v_m$, the resonance mode variation $\Delta v_m$ is given in Equation 2 shown below.

$$\begin{aligned}\Delta v_m &= \left| \frac{c}{\lambda_0} - \frac{c}{\lambda_0 + \Delta \lambda_0} \right| \qquad \text{[Equation 2]} \\ &= \frac{c}{\lambda_0}\left(\frac{\Delta \lambda_0}{\lambda_0 + \Delta \lambda_0}\right) \\ &= \frac{c}{\lambda_0} \frac{\lambda l}{l_{opt} + \Delta l} \\ &= \frac{c}{\lambda_0} \frac{\Delta l}{n_c l_0 + \Delta l}\end{aligned}$$

where, c is the velocity of light, $\lambda_0$ is a generated central wavelength of the outputted laser light, and $\Delta \lambda_0$ is the variation of the generated central wavelength according to the variation of resonance distance. The refractive index of air is assumed to be 1. The third equality in Equation 2 is based on the proportionality between the variation of the optical resonance distance $l_{opt}$ and the variation of generated wavelength. Equation 2 shows that when the resonance distance changes, the resonance mode also changes. The variation of the resonance mode is shown in FIG. 7. Referring to FIG. 7, the resonance mode indicated as the solid line varies with the resonance mode indicated as the dotted line when the mirror 111 vibrates.

As the mirror 111 of the vibration mirror unit 110 vibrates, the resonance mode changes. The variation of the resonance mode causes the change of a speckle pattern. The speckles detected by the viewer are time-averaged speckles. The variation of the speckle pattern caused in a short period of time reduces speckle contrast since latent images of the speckle pattern are averaged by overlapping with each other.

Meanwhile, a resonance mode spacing $v_m$ can be expressed in Equation 3 shown below in a frequency spectrum.

$$v_m = \frac{c}{(\lambda)_n} - \frac{c}{(\lambda)_{n-1}} = c\left(\frac{n}{2n_c l_0} - \frac{n-1}{2n_c l_0}\right) = \frac{c}{2n_c l_0} \quad \text{[Equation 3]}$$

where n is an arbitrary natural number, and $(\lambda)_n$ is wavelength of the mode. The fact that the resonance mode variation $\Delta v_m$ is equal to the resonance mode spacing $v_m$ denotes that the mode sweeping of the resonance mode occurs in the whole resonance mode region. Thus, a further mode sweeping of the resonance mode is unnecessary. Accordingly, the resonance mode variation $\Delta v_m$ may be equal to or smaller than the resonance mode spacing $v_m$. Accordingly, the maximum vibration width $\Delta l_{max}$ of the vibration mirror unit 110 can be obtained from a condition that the resonance mode spacing $v_m$ in Equation 2 is equal to the resonance mode spacing $v_m$ in Equation 3, and the result can be expressed as in Equation 4 shown below.

$$\Delta l_{max} = \frac{n_c \lambda_0 l_0}{2n_c l_0 - \lambda_0} \quad \text{[Equation 4]}$$

For example, assuming that the internal refractive index $n_c$ of the semiconductor unit 130 is 2.5 and the length $l_o$ of the vertical direction of the semiconductor unit 130 is 1 mm, the maximum vibration width $\Delta l_{max}$ of the vibration mirror unit 110 in each color can be given in the Table 1.

TABLE 1

| Color | Wavelength of laser light | Maximum vibration width $\Delta l_{max}$ |
|---|---|---|
| R | 635 nm | 317 nm |
| G | 530 nm | 265 nm |
| B | 450 nm | 225 nm |

Referring to Table 1, when the maximum vibration width $\Delta l_{max}$ of the vibration mirror unit 110 according to the present embodiment is approximately 400 nm, this means that the mode sweeping of the resonance mode has sufficiently occurred. A vibrator having a vibration width of 1 μm or less can be realized with various types of vibrators such as an electrostatic drive type resonator or a piezoelectric drive type resonator. Thus, the speckle reduction laser according to the present embodiment can be readily realized.

Figure 8:
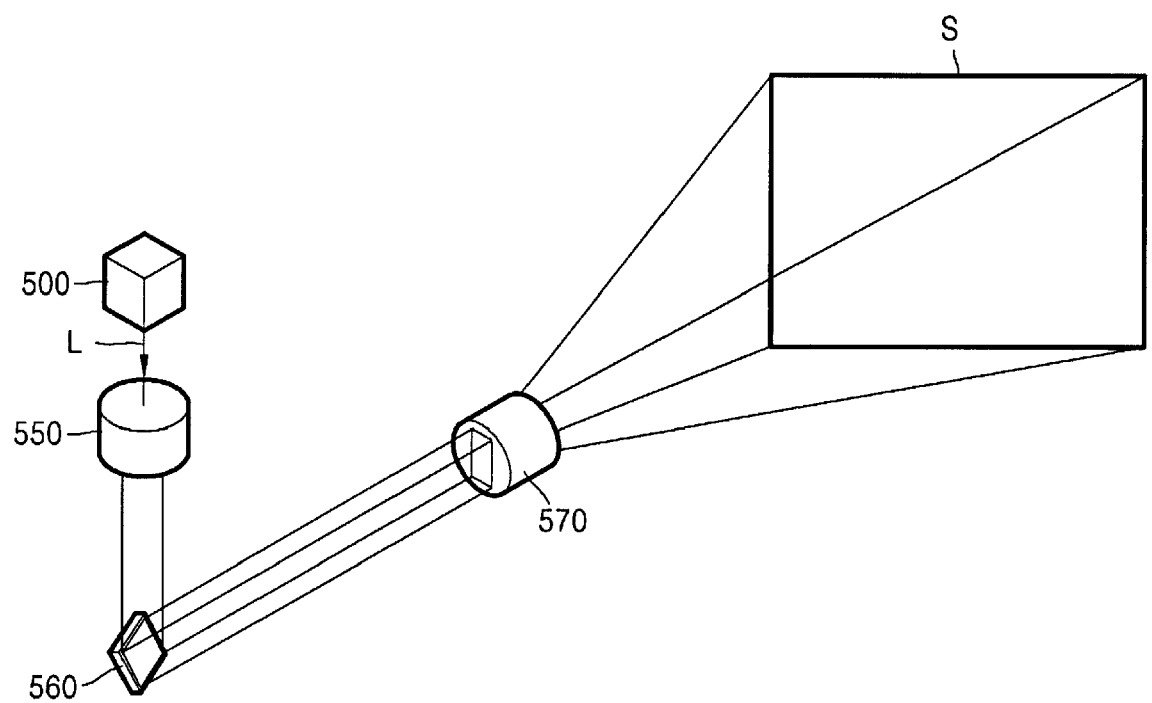
FIG. 8 is a schematic perspective view illustrating a laser display apparatus according to an exemplary embodiment of the present invention.

FIG. 8 is a schematic perspective view illustrating a laser display apparatus according to an embodiment of the present invention. The laser display apparatus displays images using a surface projection method.

Referring to FIG. 8, the laser display apparatus includes a laser lighting system 500 that provides a laser light L, a beam shaper 550 that shapes the laser light L emitted from the laser lighting system 500 into a predetermined shape, a flat panel 560 that modulates the laser light L, which is shaped by the beam shaper 550, in response to an image signal, a projection optical system 570 that projects the image formed in the flat panel 560, and a screen S on which the image is displayed.

Figure 9:
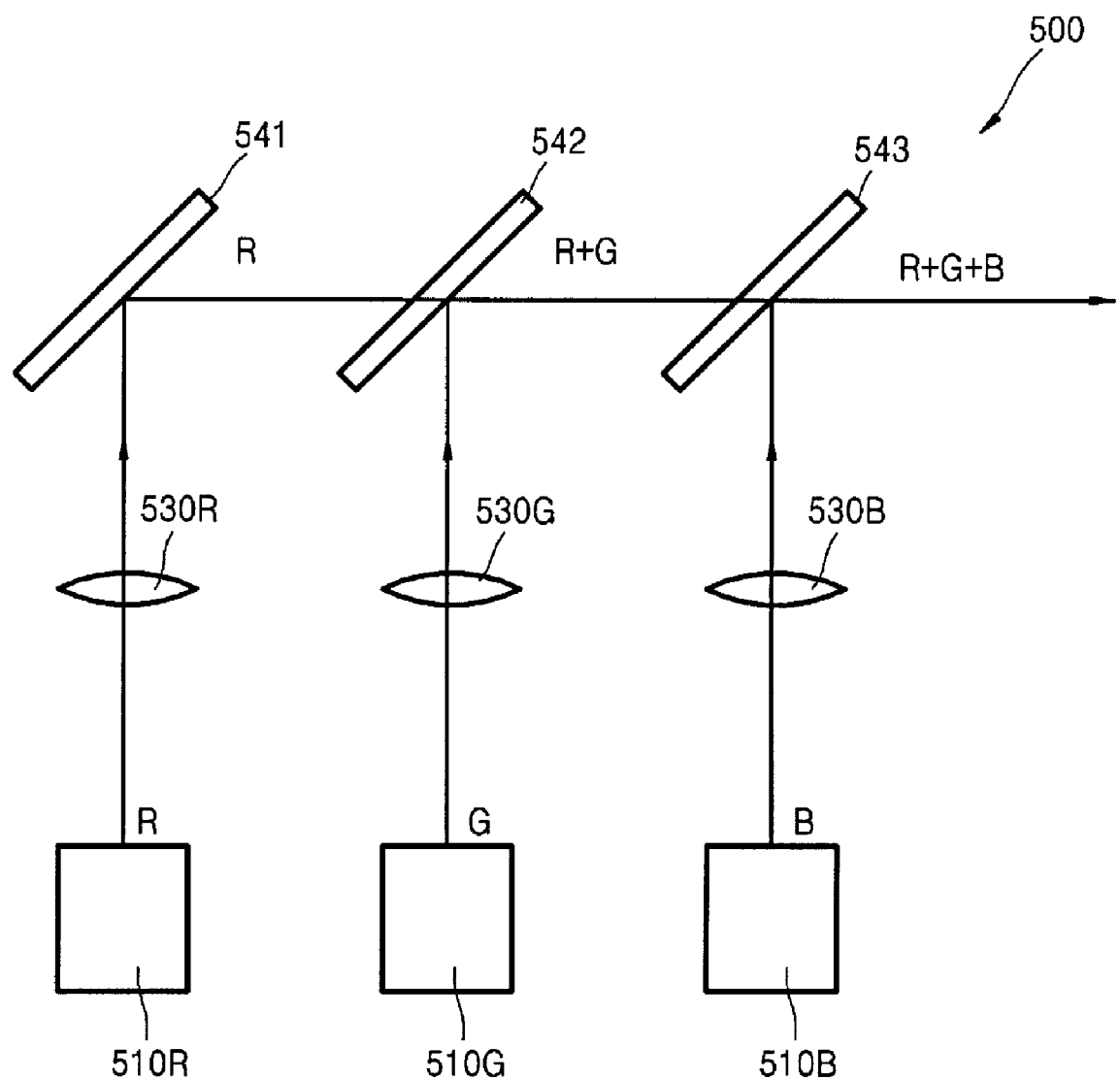
FIG. 9 is a schematic cross-sectional view illustrating the laser illuminating unit of FIG. 8, according to an exemplary embodiment of the present invention.

The laser lighting system 500, for example, as depicted in FIG. 9, can have a configuration including: red, green, and blue color laser sources 510R, 510G, and 510B that respectively emit red (R), green (G) and blue (B) color laser light having different wavelengths; and a color-light coupler for coupling optical paths of the R, G, and B laser light. Collimating lenses 530R, 530G, and 530B can be respectively disposed at output ends of the red, green, and blue color laser sources 510R, 510G, and 510B.

The red, green, and blue color laser sources 510R, 510G, and 510B are employed in the speckle reduction laser described with reference to FIGS. 1 through 7. Thus, the laser display apparatus having the speckle reduction laser can reduce or remove speckles, which will be described later.

The color-light coupler can be structured, for example, as first through third mirrors 541, 542, and 543. The second and third mirrors 542 and 543 are dichroic mirrors. The first mirror 541 is disposed at the output end of the red color laser source 510R and reflects red color laser light R. The second mirror 542 is disposed at the output end of the green color laser source 510G, reflects green color laser light G, and transmits red color laser light R. The third mirror 543 is disposed at the output end of the blue color laser source 510B, reflects blue color laser light B, and transmits red and green color laser lights R and G. With the structure described above, R, G, and B laser lights, emitted from the red, green, and blue color laser sources 510R, 510G, and 510B, can simultaneously progress by a coupling of the optical paths or can display a RGB color image according to a time division method by sequentially being turned on and off. In the present embodiment, the R, G, and B laser lights B are sequentially turned on and off. However, in the case of a point scan method which will be described later, the R, G, and B laser lights R, G, and B are coupled and progress simultaneously.

Referring to FIG. 8 again, the beam shaper 550 shapes laser light entering from the laser lighting system 500 so that the laser light can match the shape of the flat panel 560, that is, the laser light can have a rectangular cross-section having a predetermined width. The laser light emitted from the laser lighting system 500 has a circular cross-section, and the flat panel 560 has a rectangular shape having a typical aspect ratio of 4:3 or 16:9. Therefore, in order to increase the optical efficiency of the laser display apparatus, the shape of the laser beam emitted from the laser lighting system 500 may be adjusted to the shape of the flat panel 560.

The flat panel 560 is an image forming device and can be, for example, one of a liquid crystal display (LCD), a liquid crystal on silicon (LCoS), and a Digital Micromirror Device (DMD).

An image formed in the flat panel 560 is incident on the screen S through the projection optical system 570.

Figure 10:
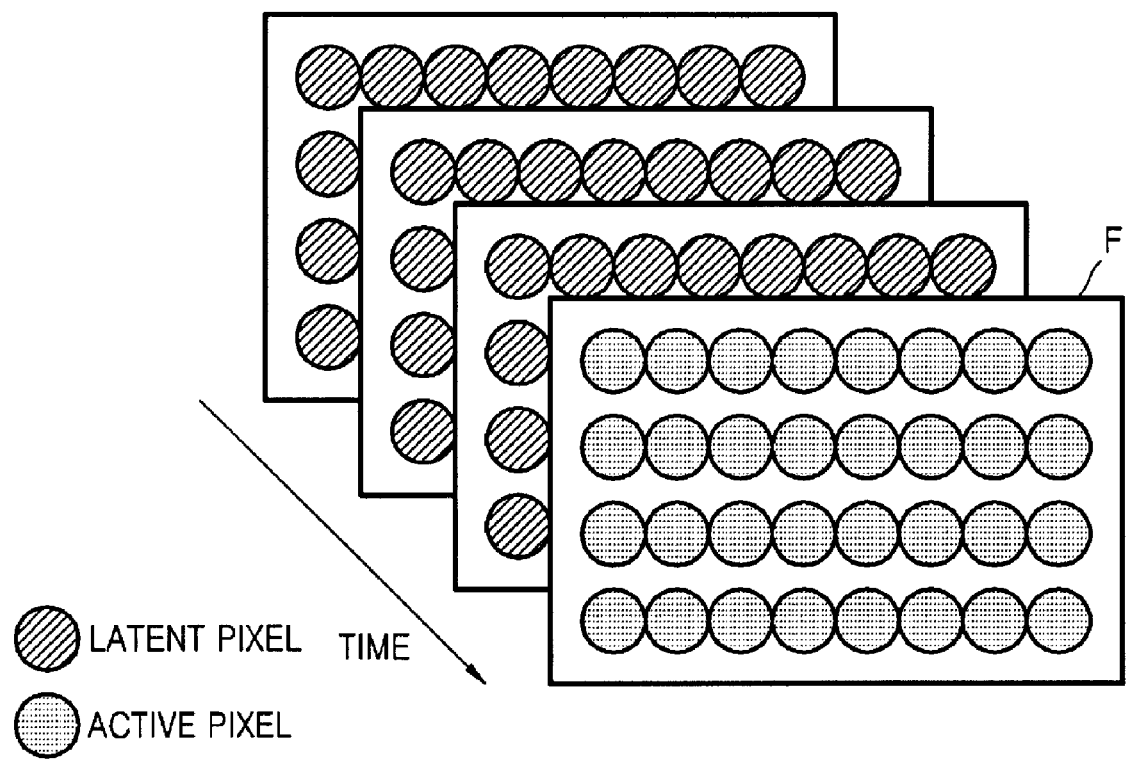
FIG. 10 is a schematic drawing for explaining an image display method of the laser display apparatus of FIG. 8, according to an exemplary embodiment of the present invention.

In the surface projection method, as depicted in FIG. 10, monochromatic image frames F of R, G, and B are formed in a unit surface. In this embodiment, the monochromatic image frames F of R, G, and B are sequentially displayed, and the viewer recognizes a color image in which a frame of active pixels at the illuminating moment and frames of latent pixels are overlapped.

The laser display apparatus according to the present embodiment forms a mono-chromatic image by overlapping images having speckle patterns different from each other by the mode sweeping of the laser light illuminated from the laser lighting system 500 while one monochromatic image frame F is projected on the screen S. That is, when the active pixels are illuminated, the laser light illuminated from the laser lighting system 500 must generate a mode sweeping. In this case, during the duty time, that is, when a monochromatic laser source is illuminated, the sweeping of the resonance mode of the identical pixels occurs to overlap the speckle patterns that are different from each other. Thus, the speckle contrast of the laser display apparatus can be made uniform, and accordingly, the overall speckles can be reduced.

For example, when an image is displayed at a frame rate of 60 Hz, each of the mono-color active pixels of R, G, and B are respectively displayed for 1/180 second. That is, the duty time of the active pixels is 5.6 ms, and a pixel frequency, which is given by the inverse of the duty time, is 180 Hz. Accordingly, the mode sweeping in the laser lighting system 500 according to the present embodiment may occur within 5.6 ms. That is, the vibration frequency of the vibration mirror unit 110 of each of the red, green, and blue color laser sources 510R, 510G, and 510B (refer to FIG. 9) must be 180 Hz or higher. In the case of a typical electrostatic drive type resonator or a piezoelectric drive type resonator, the vibration can occur in a time much shorter than 5.6 ms. Thus, an effective laser display apparatus according to the present embodiment can readily be realized using the speckle reduction laser as described above.

Figure 11:
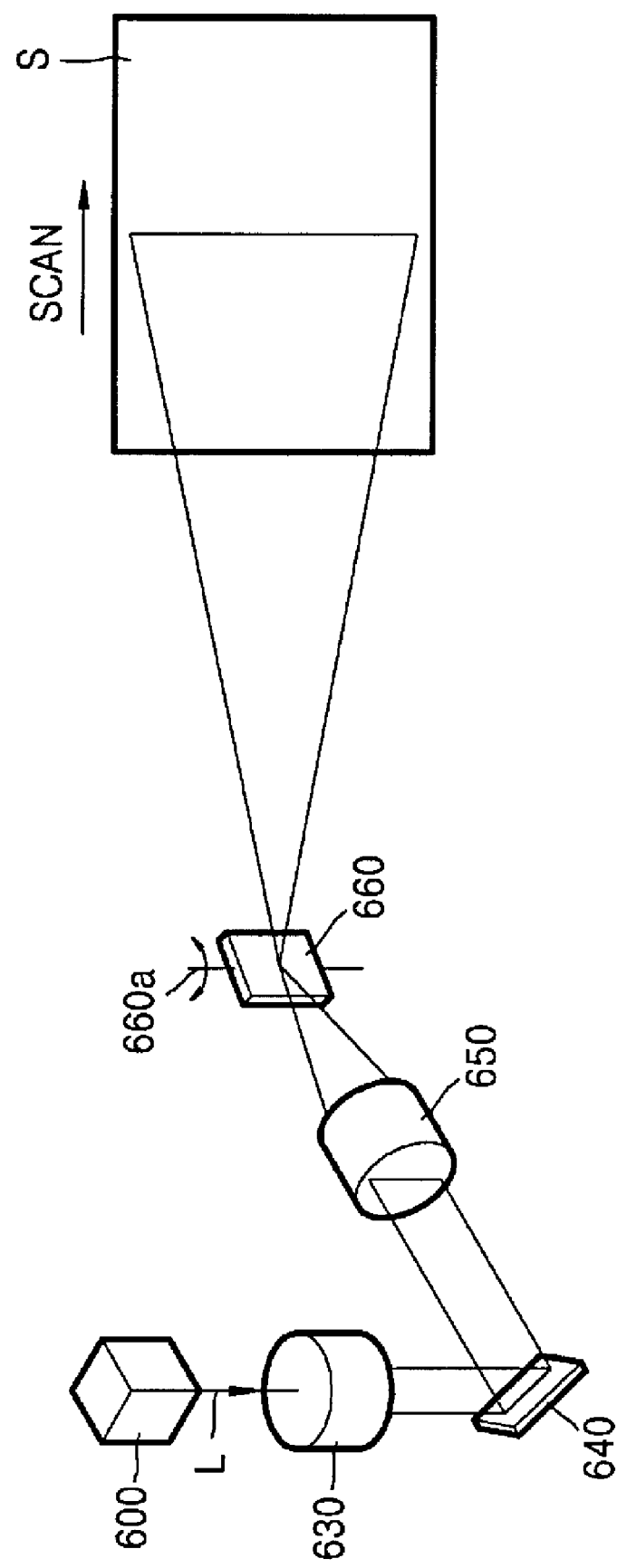
FIG. 11 is a schematic perspective view illustrating a laser display apparatus according to another exemplary embodiment of the present invention.

FIG. 11 is a schematic perspective view illustrating a laser display apparatus according to another embodiment of the present invention. The laser display apparatus according to the present embodiment displays an image using a line projection method.

Referring to FIG. 11, the laser display apparatus includes a laser lighting system 600 that provides a laser light L, a scan system that scans the laser light L emitted from the laser lighting system 600, and a screen S on which an image is formed. The scan system according to the present embodiment includes a beam shaper 630 that shapes the laser light L emitted from the laser lighting system 600 to a line-shaped beam, a line panel 640 that modulates the laser light L shaped by the beam shaper 630 in response to image signals, and a one dimensional optical scanner 660 that scans the laser light L modulated at the line panel 640.

The laser lighting system 600 illuminates the laser light L having a resonance mode that can be swept according to time. The laser lighting system 600 is substantially the same as the laser lighting system 500 described with reference to FIG. 9, and thus, the detailed description thereof will not be repeated.

The beam shaper 630 shapes the laser light L entering from the laser lighting system 600 into a line-shaped beam having a predetermined width suitable for the line panel 640. The beam shaper 630 can be, for example, a diffractive optical element (DOE).

The line panel 640 is a line type optical modulator having a one-dimension optical modulating unit, such as a grating light valve (GLV), a Samsung optical modulator (SOM), or a grating electromechanical system (GEMs). For example, a GLV controls an optical direction of light using reflection and diffraction, and has a structure in which a ribbon type array that reflects light has a line shape. The mirror array includes fixed mirrors and movable mirrors, which are alternately arranged. The mirror array includes at least one fixed mirror and at least one movable mirror in each pixel unit. The reflection direction of light can be changed using diffraction which is caused by moving the movable mirrors backwards as much as λ/4 with respect to the fixed mirrors using electrical signals. In each pixel unit, when the fixed mirrors and the movable mirrors are located on the same plane, all incident light is reflected, and thus, a bright pixel is displayed on the screen S. When the fixed mirrors are arranged on a different plane from the movable mirrors due to driving the movable mirrors, most of the reflected light is diffracted in a ±1 order, and progresses at a different angle from the incident light. As a result, the reflected light does not reach the screen S, and thus, a dark pixel is displayed on the screen S.

The one dimensional optical scanner 660 scans the linear beam modulated in the line panel 640 in a direction perpendicular to a lengthwise direction of the line panel 640, that is, in a horizontal scanning direction. The one dimensional optical scanner 660 can be, for example, a one-axis driving micro-scanner that deflects the laser light L by a minor rotation of a mirror. The one-axis driving micro-scanner has a structure in which a mirror is suspended so that the mirror can have a seesaw movement by an electrostatic effect caused by a comb-typed electrode structure. A rotation axis 660a of the mirror is disposed in a direction parallel to the longwise direction of the line panel 640. The one-dimensional optical scanner 660 can be, for example, a galvano mirror or an electromagnetic scanner. The structure of the one-dimensional optical scanner 660 is well known in the art, and thus the detailed description thereof is omitted.

The laser display apparatus according to the present embodiment may further include a projection lens unit 650 for enlarging and projecting the linear beam modulated by the line panel 640 onto a screen S. Also, the one dimensional optical scanner 660 may be located at a focal point of the projection lens unit 650 in order to minimize the size of the one-dimensional optical scanner 660 and to reduce the requirement of additional optical parts.

As described above, in the laser display apparatus according to the present embodiment, after the laser light L illuminated from the laser lighting system 600 is shaped to a linear beam having a predetermined width, the laser light L enters the line panel 640. The linear laser light that includes one line image information modulated by the line panel 640 in response to an image signal is focused by the projection lens unit 650, and is scanned on the screen S in a direction perpendicular to the lengthwise direction of the line panel 640, for example, in a horizontal scanning direction by the one-dimensional optical scanner 660 located on the focal point of the projection lens unit 650.

The laser display apparatus having the above structure forms a two-dimensional image on the screen S by the combination of the line panel 640 and the one dimensional optical scanner 660.

Figure 12:
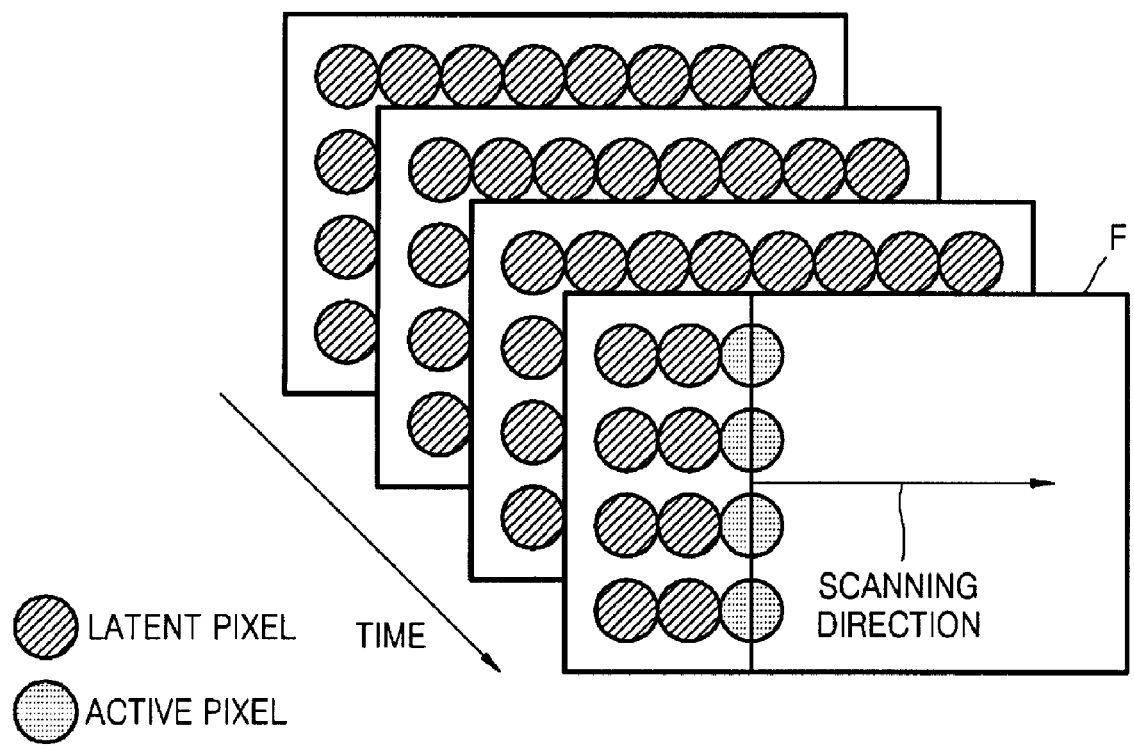
FIG. 12 is a schematic drawing for explaining an image display method of the laser display apparatus of FIG. 11, according to an exemplary embodiment of the present invention.

The method of displaying an image using the line panel 640 is a so called 'line projection method', that is, as depicted in FIG. 12, a method of forming mono-chromatic image frames F of R, G, and B by scanning a linear beam. The viewer recognizes a color image in which a frame of active pixels at the illuminating moment and frames of latent pixels are overlapped.

In order to effectively reduce the speckles, when the frame of active pixels is maintained, one frame of the active pixels must be formed by overlapping pixels having speckle patterns different from each other. That is, a mode sweeping of the laser light L illuminated from the laser lighting system 600 must occur when the frame of active pixels is maintained. In this case, during a duty time, i.e., while a monochromatic laser source is illuminated with respect to the same pixels, the mode sweeping of the resonance mode occurs to overlap the speckle patterns different from each other. Thus, the speckle contrast of the laser display apparatus can be made uniform, and accordingly, the overall speckles can be reduced.

For example, when an image of VGA resolution is displayed at a frame rate of 60 Hz, each of the active pixels arranged linearly is displayed for 1/(180×640)s. That is, the duty time of each of the active pixels is 8.7 μs, and a pixel frequency is 115 kHz. Accordingly, when an image with a VGA resolution is displayed, the mode sweeping in the laser lighting system 600 according to the present embodiment may occur within 8.7 μs. Table 2 summarizes the duty time of active pixels and required vibration frequency of a vibration mirror unit of a laser light source for each resolution of a line projection type laser display apparatus like in the present embodiment.

TABLE 2

|  | Resolution | Duty time | Required vibration frequency |
|---|---|---|---|
| VGA | 640 × 480 | 8.7 μs | 115 kHz |
| SVGA | 800 × 600 | 6.9 μs | 144 kHz |
| HD | 1280 × 720 | 4.3 μs | 230 kHz |

Referring to Table 2, in the case of an HD class resolution, the required vibration frequency of the vibration mirror unit of a laser source must be at least 230 kHz. In the case of the typical electrostatic drive type resonator or a piezoelectric drive type resonator, this level of vibration frequency can be easily achieved. Thus, an effective speckle reduction can be achieved in a line projection type laser display apparatus.

Figure 13:
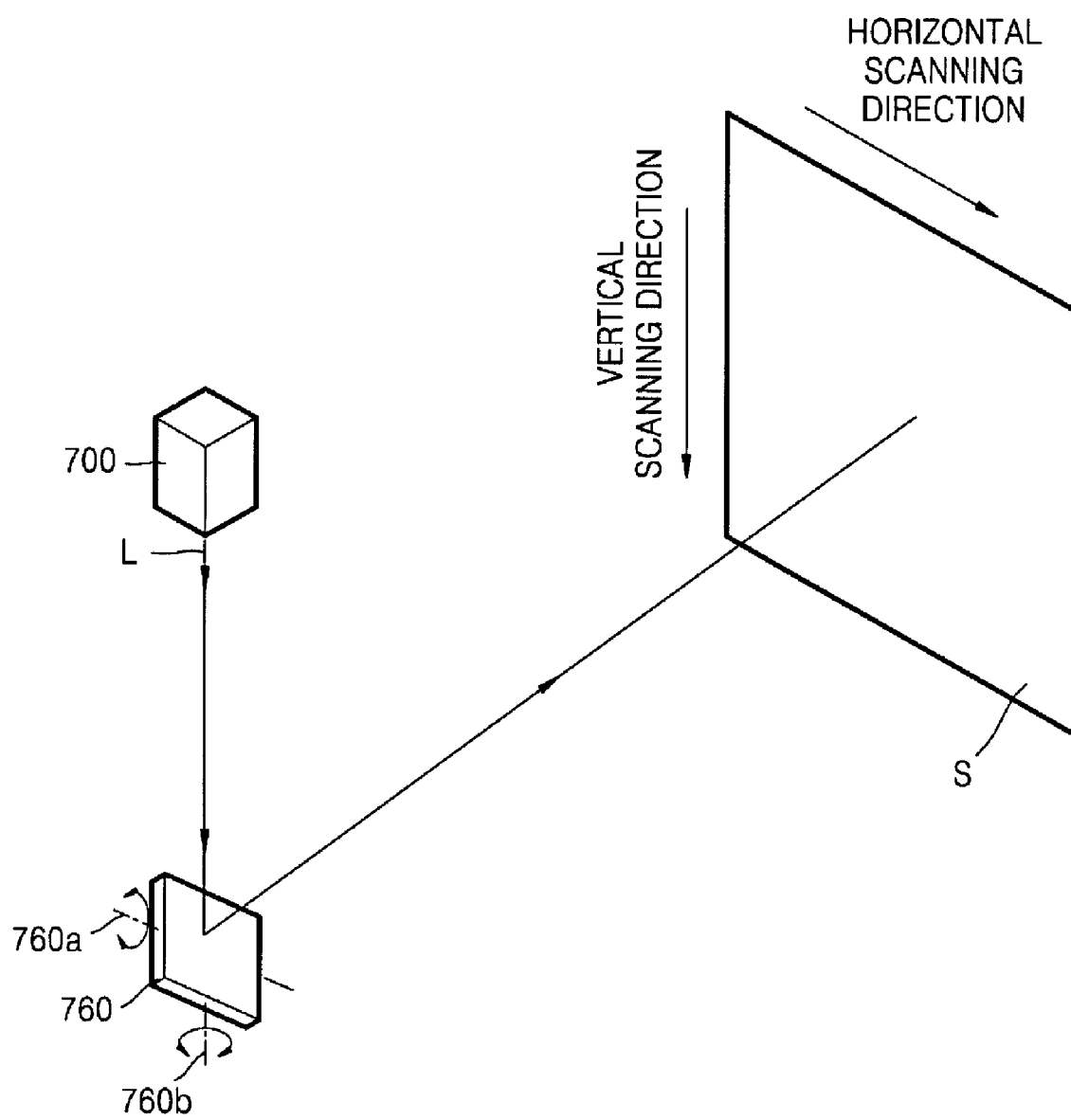
FIG. 13 is a schematic perspective view illustrating a laser display apparatus according to still another exemplary embodiment of the present invention.

FIG. 13 is a schematic perspective view illustrating a laser display apparatus according to still another embodiment of the present invention. The laser display apparatus according to the present embodiment displays an image using a raster scanning display method, that is, a point projection method.

Referring to FIG. 13, the laser display apparatus includes a laser lighting system 700 that illuminates a laser light L, a two-dimensional optical scanner 760 that scans the laser light L emitted from the laser lighting system 700, and a screen S on which an image is formed.

In the present embodiment, the laser lighting system 700 illuminates R, G, and B color lasers in response to image signals. The laser lighting system 700 according to the present embodiment is substantially the same as the laser lighting system 500 described with reference to FIG. 9 except that the laser lighting system 700 according to the present embodiment illuminates modulated R, G, and B color lasers and thus, the detailed description thereof will not be repeated. In the case of the laser lighting system 500 depicted in FIG. 9, each of the R, G, and B color laser sources 510R, 510G, and 510B is modulated by a direct modulation method by which laser light L itself is directly modulated. However, in the case of the laser lighting system 700, the method of modulation is not limited to the direct modulation. For example, the R, G, and B color lights emitted from the R, G, and B color laser sources 510R, 510G, and 510B can be modulated by an additional external modulator (not shown), and afterwards, the R, G, and B color lights can be coupled through the first through third color mirrors 541, 542, and 543 (refer to FIG. 9). The two-dimensional optical scanner 760 scans the laser light L emitted from the laser lighting system 700 on a screen S in horizontal and vertical directions alternately. The two-dimensional optical scanner 760 can be, for example, a two-axis driving micro-scanner that deflects the laser light L by a minor rotation of a mirror. The two-axis micro-scanner is well known in the art, and thus, the detailed description thereof will be omitted.

Figure 14:
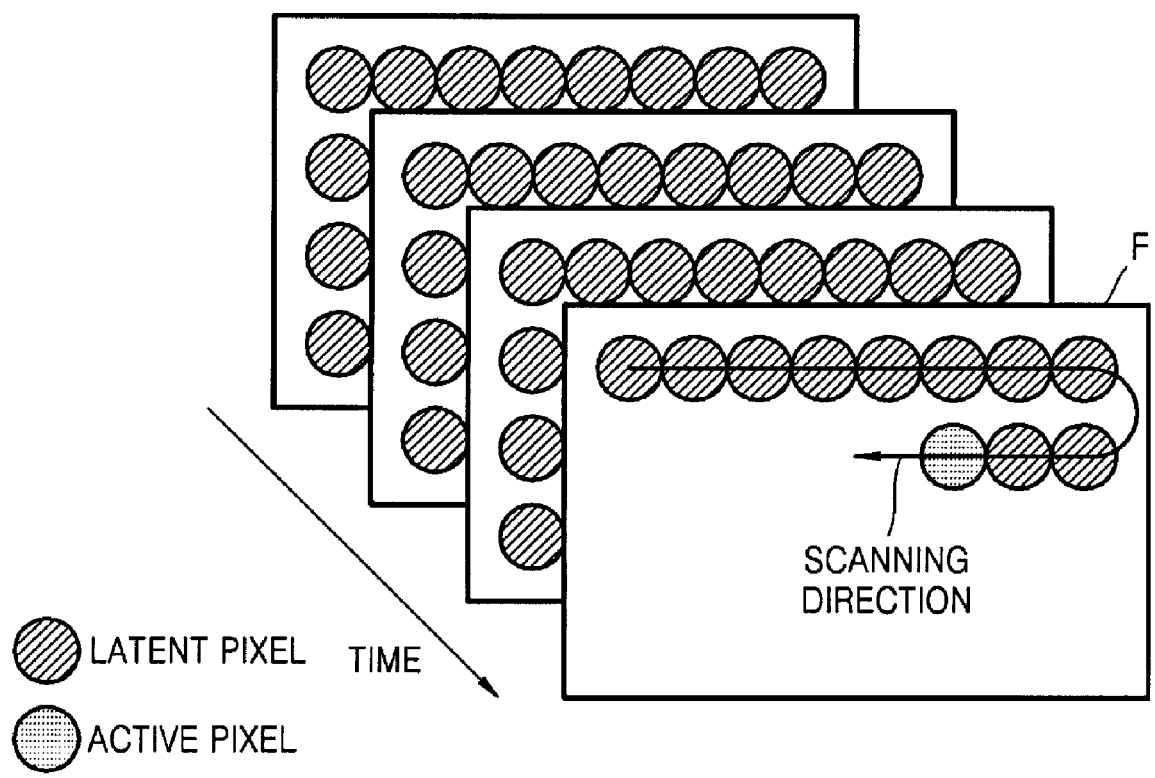
FIG. 14 is a schematic drawing for explaining an image display method of the laser display apparatus of FIG. 13, according to an exemplary embodiment of the present invention.

As depicted in FIG. 14, the laser display apparatus according to the present embodiment sequentially displays each pixel one by one by scanning the laser light L emitted from the laser lighting system 700 using the two-dimensional optical scanner 760. This manner of color image realization is well known in the art, thus, the detailed description thereof will be omitted.

For example, when an image with VGA resolution is displayed at a frame rate of 60 Hz, the time for the active pixels is displayed is 1/(60×640×480) s. That is, the duty time of each of the active pixels is 54.3 ns and the pixel frequency is 18 MHz. Accordingly, when an image with VGA resolution is displayed, the mode sweeping in the laser lighting system 700 according to the present embodiment may occur within 54.3 ns. Table 3 summarizes the duty time of active pixels and the required vibration frequency of a vibration mirror unit of a laser light source in a point projection type laser display apparatus like in the present embodiment.

TABLE 3

|  | Resolution | Duty time | Required vibration frequency |
|---|---|---|---|
| VGA | 640 × 480 | 54.3 ns | 18 MHz |
| SVGA | 800 × 600 | 34.7 ns | 29 MHz |
| HD | 1280 × 720 | 18.1 ns | 55 MHz |

Referring to Table 3, in the case of a HD class resolution, the required vibration frequency of the vibration mirror unit of a laser source must be at least 55 MHz. In the case of the typical electrostatic drive type resonator or a piezoelectric drive type resonator, this level of vibration frequency can be easily achieved. Thus, an effective speckle reduction can be achieved in a point projection type laser display apparatus. As described above, speckles can be removed or reduced when the present invention is applied to not only a surface projection type laser display apparatus or a line projection type laser display apparatus but also a point projection type laser display apparatus.

The laser display apparatuses described above includes the screen S. However, the screen S is not an essential element for the laser display apparatus according to the present invention. The laser display apparatus according to the present invention can project an image onto an external screen such as a projector.

As described above, in a speckle reduction laser according to the present invention, speckles can be reduced through sweeping a resonance mode by mounting a vibrating mirror in a resonance path. The vibrating mirror can be readily realized using a well known resonator in the art. Furthermore, a laser display apparatus having the speckle reduction laser can easily meet the mode sweeping conditions for reducing the speckles. Therefore, the speckle reduction laser can be applied to various projection method such as a surface projection type laser display apparatus, a line projection type laser display apparatus, and a point projection type laser display apparatus.

While the present invention, that is, a speckle reduction laser and a laser display apparatus having the speckle reduction laser, has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A speckle reduction laser comprising:
   a semiconductor unit that comprises an active layer and emits laser light through a first side surface thereof by resonating light generated from the active layer; and
   a vibration mirror unit, disposed at a second side surface of the semiconductor unit, and comprising a mirror,
   wherein a resonance of the laser light is generated between the first side surface of the semiconductor unit and the mirror, and a resonance mode of the laser light is changed according to a vibration of the mirror.

2. The speckle reduction laser of claim 1, further comprising an antireflective member provided on the second side surface of the semiconductor unit.

3. The speckle reduction laser of claim 1, wherein the semiconductor unit further comprises a half mirror disposed on the first side surface, wherein the laser light is emitted through the half mirror.

4. The speckle reduction laser of claim 1, wherein a variation width of the resonance mode of the laser light is equal to or smaller than a resonance modes spacing when the resonance mode is viewed in a frequency spectrum.

5. The speckle reduction laser of claim 1, wherein the semiconductor unit has a limited resonance region defined by a ridge structure on the active layer.

6. The speckle reduction laser of claim 1, wherein the vibration mirror unit comprises a vibrator on which the mirror is attached.

7. A laser display apparatus that displays an image by scanning laser light on a screen, the apparatus comprising:
 a laser lighting system comprising a speckle reduction laser that comprises:
  a semiconductor unit that comprises an active layer and that emits laser light through a first side surface thereof by resonating light generated from the active layer; and
  a vibration mirror unit disposed at a second side surface of the semiconductor unit and comprising a mirror,
 wherein a resonance of the laser light is generated between the first side surface of the semiconductor unit and the mirror, and a resonance mode of the laser light is changed according to a vibration of the mirror.

8. The laser display apparatus of claim 7, further comprising a reflection preventive member provided disposed on the second side surface of the semiconductor unit.

9. The laser display apparatus of claim 7, wherein the speckle reduction laser further comprises a half mirror provided on the first side surface of the semiconductor unit, wherein the laser light is emitted through the half mirror.

10. The laser display apparatus of claim 7, wherein a variation width of a resonance mode of the laser light is equal to or smaller than a resonance modes spacing when the resonance mode is viewed in a spectrum.

11. The laser display apparatus of claim 7, wherein the semiconductor unit has a limited resonance region defined by a ridge structure on the active layer.

12. The laser display apparatus if claim 7, wherein the vibration mirror unit comprises a vibrator on which the mirror is attached.

13. The laser display apparatus of claim 7, a vibration frequency of the vibration mirror unit is equal to or greater than a pixel frequency of an image displayed by the laser display apparatus.

14. The laser display apparatus of claim 7, further comprising:
 an image forming device that forms an image corresponding to an image signal input from laser light emitted from the laser lighting system; and
 a projection optical system that enlarges and projects an image, formed in the image forming device, onto a screen.

15. The laser display apparatus of claim 7, further comprising a scan system that forms an image by scanning the laser light emitted from the laser lighting system onto the screen.

16. The laser display apparatus of claim 15, wherein the scan system comprises a two-dimensional optical scanner that scans a beam emitted from the laser lighting system in horizontal and vertical directions.

17. The laser display apparatus of claim 15, wherein the scan system comprises:
 a beam shaper that shapes incident light so that a cross-sectional shape of light emitted from the laser lighting system has a linear shape;
 a line panel that modulates light shaped by the beam shaper in response to an image signal; and
 a one-dimensional optical scanner that scans light emitted from the laser lighting system in a direction perpendicular to a lengthwise direction of the line panel after modulating the light in response to an image signal.

* * * * *